United States Patent
Kado et al.

(10) Patent No.: US 9,523,156 B2
(45) Date of Patent: Dec. 20, 2016

(54) SIC SINGLE CRYSTAL INGOT AND PRODUCTION METHOD THEREFOR

(71) Applicants: TOYOTA JIDOSHA KABUSHIKI KAISHA, Toyota-shi, Aichi (JP); NIPPON STEEL & SUMITOMO METAL CORPORATION, Tokyo (JP)

(72) Inventors: Motohisa Kado, Susono (JP); Hironori Daikoku, Susono (JP); Hidemitsu Sakamoto, Susono (JP); Kazuhiko Kusunoki, Tokyo (JP); Nobuhiro Okada, Tokyo (JP)

(73) Assignees: TOYOTA JIDOSHA KABUSHIKI KAISHA, Toyota (JP); NIPPON STEEL & SUMITOMO METAL CORPORATIN, Tokyo (JP)

( * ) Notice: Subject to any disclaimer, the term of this patent is extended or adjusted under 35 U.S.C. 154(b) by 0 days.

(21) Appl. No.: 14/415,407

(22) PCT Filed: May 8, 2013

(86) PCT No.: PCT/JP2013/062955
§ 371 (c)(1),
(2) Date: Jan. 16, 2015

(87) PCT Pub. No.: WO2014/013773
PCT Pub. Date: Jan. 23, 2014

(65) Prior Publication Data
US 2015/0167196 A1 Jun. 18, 2015

(30) Foreign Application Priority Data
Jul. 19, 2012 (JP) .............................. 201 2-1 6081 6

(51) Int. Cl.
*B32B 3/00* (2006.01)
*C30B 19/10* (2006.01)
(Continued)

(52) U.S. Cl.
CPC ................ *C30B 19/10* (2013.01); *C30B 9/06* (2013.01); *C30B 17/00* (2013.01); *C30B 19/04* (2013.01);
(Continued)

(58) Field of Classification Search
CPC ........ C30B 19/04; C30B 19/10; C30B 19/062; C30B 19/068; C30B 17/00; C30B 29/36; Y10T 428/21; Y10T 428/24488
See application file for complete search history.

(56) References Cited

U.S. PATENT DOCUMENTS

2007/0209573 A1  9/2007 Kusunoki et al.
2011/0200833 A1* 8/2011 Kamei ..................... C30B 9/10
428/446
(Continued)

FOREIGN PATENT DOCUMENTS

CN    102264955 A   11/2011
JP    2005-089223 A  4/2005
(Continued)

*Primary Examiner* — Elizabeth Mulvaney
(74) *Attorney, Agent, or Firm* — Oliff PLC

(57) ABSTRACT

Provided are: a high-quality SiC single crystal ingot that suppresses the generation of inclusions; and a production method for said SiC single crystal ingot. The present invention pertains to a SiC single crystal ingot including a seed crystal substrate and a SiC growth crystal grown using the solution method and using the seed crystal substrate as the origin thereof, the growth crystal having a recessed crystal growth surface and not including inclusions.

12 Claims, 10 Drawing Sheets

(51) Int. Cl.
  *C30B 29/36* (2006.01)
  *C30B 17/00* (2006.01)
  *C30B 9/06* (2006.01)
  *C30B 19/04* (2006.01)
  *C30B 19/06* (2006.01)

(52) U.S. Cl.
  CPC ........... C30B 19/062 (2013.01); C30B 19/068 (2013.01); C30B 29/36 (2013.01); *Y10T 117/1008* (2015.01); *Y10T 428/21* (2015.01); *Y10T 428/24488* (2015.01)

(56) References Cited

U.S. PATENT DOCUMENTS

| | | |
|---|---|---|
| 2011/0315073 A1 | 12/2011 | Sakamoto et al. |
| 2012/0160153 A1 | 6/2012 | Ishii et al. |
| 2012/0211769 A1 | 8/2012 | Kusunoki et al. |
| 2014/0007807 A1 | 1/2014 | Daikoku et al. |
| 2014/0299046 A1 | 10/2014 | Domoto et al. |

FOREIGN PATENT DOCUMENTS

| | | |
|---|---|---|
| JP | 2006-117441 A | 5/2006 |
| JP | 2007-186356 A | 7/2007 |
| JP | 2007-186374 A | 7/2007 |
| JP | 2010-184838 A | 8/2010 |
| JP | 2010-208926 A | 9/2010 |
| JP | 2010-248003 A | 11/2010 |
| JP | 2011-251881 A | 12/2011 |
| JP | 2013-147397 A | 8/2013 |
| WO | 2010/103387 A1 | 9/2010 |
| WO | 2011/024931 A1 | 3/2011 |
| WO | 2013/062130 A1 | 5/2013 |

\* cited by examiner

5mm

PERIPHERAL SECTION　　　　　1mm　　CENTER SECTION

PERIPHERAL SECTION　　　　　1mm　　CENTER SECTION

SIC SINGLE CRYSTAL INGOT AND PRODUCTION METHOD THEREFOR

TECHNICAL FIELD

The present invention relates to a SiC single crystal that is suitable for a semiconductor element, and to a method for producing it, and more specifically it relates to a high-quality SiC single crystal ingot with few inclusions and a method for producing a high-quality SiC single crystal ingot with few inclusions by a solution process.

BACKGROUND ART

SiC single crystals are thermally and chemically very stable, superior in mechanical strength, and resistant to radiation, and also have superior physical properties, such as high breakdown voltage and high thermal conductivity, compared to Si single crystals. They are therefore able to exhibit high output, high frequency, voltage resistance and environmental resistance that cannot be realized with existing semiconductor materials, such as Si single crystals and GaAs single crystals, and are being considered ever more promising as next-generation semiconductor materials for a wide range of applications including power device materials that allow high power control and energy saving, device materials for high-speed large volume information communication, high-temperature device materials for vehicles, radiation-resistant device materials and the like.

Typical growth processes for growing SiC single crystals that are known in the prior art include gas phase processes, the Acheson process, and solution processes. Among gas phase processes, for examples, sublimation processes have drawback in that grown single crystals have been prone to hollow penetrating defects known as "micropipe defects", lattice defects, such as stacking faults, and generation of polymorphic crystals. However, most SiC bulk single crystals are conventionally produced by sublimation processes because of the high crystal growth rate, with attempts being made to reduce defects in the grown crystals. In the Acheson process, heating is carried out in an electric furnace using silica stone and coke as starting materials, and therefore it has not been possible to obtain single crystals with high crystallinity due to impurities in the starting materials.

Solution processes are processes in which molten Si or an alloy melted in molten Si is formed in a graphite crucible and C is dissolved from the graphite crucible into the molten liquid, and a SiC crystal layer is deposited and grown on a seed crystal substrate set in the low temperature section. Solution processes are most promising for reducing defects because crystal growth is carried out in a state of near thermal equilibrium, compared to gas phase processes. Recently, therefore, methods for producing SiC single crystals by solution processes have been proposed.

However, numerous technical problems still remain for obtaining large-area SiC crystals by solution processes, at high quality and with a high growth rate. A particular technical problem in regard to achieving high quality of SiC that has been noted is generation of inclusions in the SiC crystal during growth of the SiC single crystal.

Inclusions are generated by involving the Si—C solution used for SiC single crystal growth in the grown crystal. Generation of inclusions constitutes macrodefects for a single crystal, and these are unacceptable for device materials.

For the purpose of providing a method for producing a SiC single crystal capable of producing a high-quality SiC single crystal at high speed that has no inclusions in the crystal, there has been disclosed a method for producing a SiC single crystal by a solution process, wherein a molten liquid is stirred in a crucible by periodically changing the rotational speed or the rotational speed and rotational direction of the crucible (PTL 1).

CITATION LIST

Patent Literature

[PTL 1] Japanese Unexamined Patent Publication No. 2006-117441

SUMMARY OF THE INVENTION

Problems to be Solved by the Invention

In the method of PTL 1, however, both the crucible and the seed shaft are rotated and it is necessary to synchronize the rotation of the seed shaft and the rotation of the crucible, thus complicating the procedure, while it is still insufficient for stable growth of a SiC single crystal containing absolutely no inclusions throughout.

It is an object of the present invention to solve the problem described above and to provide a high-quality SiC single crystal ingot with minimal generation of inclusions, as well as a method for producing the SiC single crystal ingot.

Means for Solving the Problems

The invention is a method for producing a SiC single crystal by a solution process in which a seed crystal substrate held on a seed crystal holding shaft is contacted with a Si—C solution having a temperature gradient such that the temperature decreases from the interior toward the surface, to cause crystal growth of the SiC single crystal, the method comprising lowering the temperature of the Si—C solution at the outer peripheral section directly below the interface with the crystal growth plane to be lower than the temperature of the Si—C solution at the center section directly below the interface with the crystal growth plane, and causing the Si—C solution to flow from the center section directly below the interface with the crystal growth plane to the outer peripheral section.

The invention is also an apparatus for production of a SiC single crystal by a solution process in which a seed crystal substrate held on a seed crystal holding shaft is contacted with a Si—C solution heated so as to have a temperature gradient such that the temperature decreases from the interior toward the surface, to cause crystal growth of the SiC single crystal from the seed crystal substrate, comprising:

a crucible that houses a Si—C solution, a heating device situated surrounding the crucible, and a seed crystal holding shaft situated in a movable manner in the up-down direction, the apparatus further comprising:

a temperature control means that lowers the temperature of the Si—C solution at the outer peripheral section directly below the interface with the crystal growth plane to be lower than the temperature of the Si—C solution at the center section directly below the interface with the crystal growth plane, and a flow means that causes the Si—C solution to flow from the center section directly below the interface with the crystal growth plane to the outer peripheral section.

The invention is also a SiC single crystal ingot containing a seed crystal substrate and a SiC grown crystal grown from the seed crystal substrate by using a solution process, wherein the grown crystal has a concave crystal growth plane and contains no inclusions.

Effect of the Invention

According to the invention it is possible to obtain a high-quality SiC single crystal with minimal generation of inclusions.

BRIEF DESCRIPTION OF THE DRAWINGS

FIG. 16 is a cross-sectional photograph of the SiC grown crystal obtained in Comparative Example 7.

DESCRIPTION OF EMBODIMENTS

Figure 1:
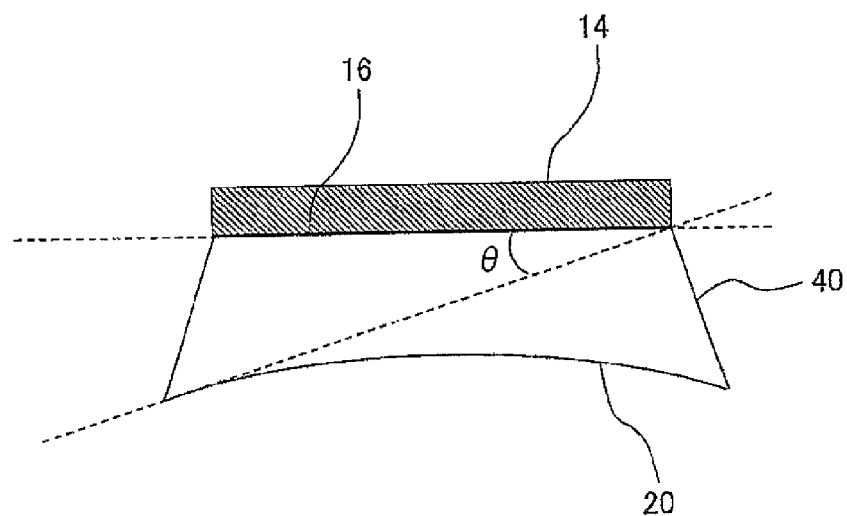
FIG. 1 is a cross-sectional schematic drawing of a SiC single crystal ingot having a concave crystal growth plane according to the invention.

Throughout the present specification, the indication "-1" in an expression, such as "(000-1) face", is used where normally a transverse line is placed over the numeral.

As a result of diligent research on minimizing generation of inclusions during SiC single crystal growth, the present inventors have discovered a SiC single crystal that contains no inclusions, and a method for producing it.

The invention is a SiC single crystal ingot containing a seed crystal substrate and a SiC grown crystal grown from the seed crystal substrate by using a solution process, wherein the grown crystal has a concave crystal growth plane and contains no inclusions.

According to the invention it is possible to obtain a SiC single crystal that has a concave crystal growth plane and contains no inclusions. As used herein, "inclusions" refers to components of the Si—C solution used for SiC single crystal growth incorporated into the grown crystal. When inclusions are generated in a grown crystal, solvent components, such as Cr or Ni that may be present in the solvent used as the Si—C solution, may be detected as the inclusions.

A solution process is a method for producing a SiC single crystal in which a SiC seed crystal is contacted with a Si—C solution having a temperature gradient such that the temperature decreases from the interior toward the surface, to grow a SiC single crystal. By forming a temperature gradient in which the temperature decreases from the interior of the Si—C solution toward the surface of the solution, the surface region of the Si—C solution becomes supersaturated and a SiC single crystal is grown from the seed crystal substrate contacting with the Si—C solution.

Growth on just plane, for example, growth on (0001) just plane, by a conventional solution process, allows growth of a clean SiC single crystal to occur at first, but as growth proceeds, irregularities become generated on the growth surface (flat plane) producing defects, and it becomes difficult to accomplish satisfactory single crystal growth to the desired thickness. Furthermore, even if a partially clean crystal is obtained, inclusions become incorporated throughout, making it difficult to obtain a crystal that contains no inclusions throughout its entirety in the direction of the desired thickness and in the desired diameter direction. Even when a seed crystal substrate having a growth surface with an off-angle is used, it tends to have immediate growth on the just plane, and giant step bunching is likely to occur due to lack of a growth promoting part after the growth on just plane occurs.

According to the invention it is possible to obtain a high-quality SiC single crystal without such problems and containing no inclusions, by carrying out crystal growth so as to have a concave crystal growth plane.

The SiC grown single crystal of the invention has a concave crystal growth plane, wherein a portion of the center section of the concave crystal growth plane is substantially parallel to the just plane of crystal growth, and the slope of the concave crystal growth plane increases toward the outer peripheral section of the growth surface. The maximum angle θ of the slope of the concave crystal growth plane with respect to the just plane of crystal growth is preferably in the range of $0<\theta\leq8°$, more preferably in the range of $1\leq\theta\leq8°$, even more preferably in the range of $2\leq\theta\leq8°$ and yet more preferably in the range of $4\leq\theta\leq8°$. If the maximum angle θ of the slope of the concave crystal growth plane is within the aforementioned range, it will be easier to minimize generation of inclusions.

The maximum angle θ of the slope can be measured by any desired method. For example, when a SiC single crystal with a concave crystal growth plane 20 is grown by using a seed crystal substrate 14 having a just plane 16, as shown in FIG. 1, it is possible to measure the maximum angle θ as the slope of the tangent line on the outermost periphery of the concave crystal growth plane 20 with respect to the just plane 16 of the seed crystal substrate 14.

In the invention, the growth surface of the SiC single crystal may be the (0001) face (also referred to as the Si-face) or the (000-1) face (also referred to as the C-face).

The growth thickness of the SiC grown single crystal according to the invention is preferably 1 mm or greater, more preferably 2 mm or greater, even more preferably 3 mm or greater, yet more preferably 4 mm or greater and even yet more preferably 5 mm or greater. According to the invention it is possible to obtain a SiC single crystal that contains no inclusions across the aforementioned entire thickness range.

The diameter of the SiC grown single crystal according to the invention is preferably 3 mm or greater, more preferably 6 mm or greater, even more preferably 10 mm or greater and yet more preferably 15 mm or greater. According to the invention it is possible to obtain a SiC single crystal that contains no inclusions across the aforementioned entire diameter range.

The SiC single crystal having a thickness and/or diameter exceeding the aforementioned thickness and/or diameter may be grown, and more preferably it contains no inclusions even in the crystalline region exceeding the aforementioned thickness and/or diameter. However, the invention does not exclude a SiC single crystal containing inclusions in the crystalline region exceeding the aforementioned thickness and/or diameter, so long as the SIC single crystal obtained has no inclusions throughout the region having the aforementioned thickness and/or diameter. Thus, the maximum angle θ of the slope of the concave crystal growth plane may be measured, for example, as the angle with respect to the just plane 16 at a location where the desired diameter is obtained in the crystal growth plane 20.

In order to grow the crystal growth plane in a concave manner, it is effective to increase the degree of supersaturation of the Si—C solution at the outer peripheral section directly below the interface with the crystal growth plane, so as to be greater than the degree of supersaturation of the Si—C solution at the center section directly below the interface with the crystal growth plane. This will allow the amount of crystal growth in the horizontal direction to be at a gradient for growth of the crystal growth plane in a concave manner, so that the crystal growth plane as a whole will not be on the just plane.

If the Si—C solution is caused to flow from the center section to the outer peripheral section directly below the interface with the crystal growth plane, pooling of the Si—C solution can be minimized and it is possible to stably supply solute to the entire growth interface including the outer peripheral section while supplying solute to the center section that has slower growth of the concave growth surface, and to obtain a SiC single crystal having a concave growth surface and containing no inclusions.

Flow of the Si—C solution from the center section to the outer peripheral section directly below the interface with the crystal growth plane can be performed by mechanical stirring of the Si—C solution or by electrical magnetic stirring using high-frequency heating, to cause the Si—C solution to flow from the depth of the Si—C solution toward the crystal growth plane, and further cause the Si—C solution to flow from the center section to the outer peripheral section, forming a flow such that the Si—C solution circulates from the outer peripheral section to the depth.

Figure 2:
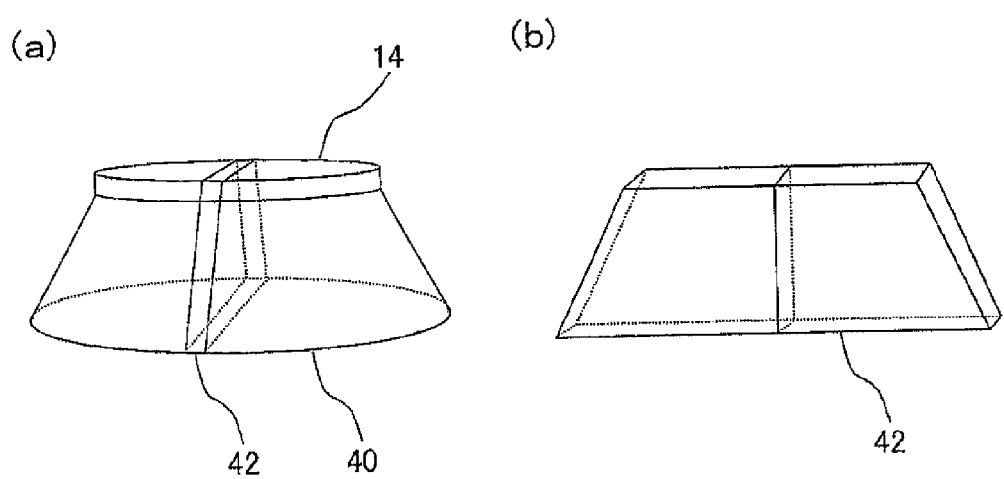
FIG. 2 is a pair of schematic diagrams showing the locations where grown crystals are cut when examining the presence of inclusions in the grown crystal.

The method of examining inclusions is not particularly restricted, and as shown in FIG. 2(*a*), the grown crystal 40 may be sliced parallel to the growth direction to cut a grown crystal 42 as shown in FIG. 2(*b*), and observation may be made of whether or not the entire surface of the grown crystal 42 is a continuous crystal based on a transmission image, to allow examination of the presence of inclusions. When the grown crystal 40 is grown in a substantially concentric manner, it may be further out in half at the center section of the cut out grown crystal 42, and the presence of inclusions in the half-cut grown crystal 42 may be examined by the same method. The grown crystal may be sliced perpendicular to the growth direction, and the presence of inclusions in the cut grown crystal may be examined by the same method. Also, the grown crystal may be cut out as described above and subjected to energy dispersive X-ray spectroscopy (EDX) or wavelength dispersive X-ray analysis (WDX) for qualitative analysis or quantitative analysis of the Si—C solution component in the cut out grown crystal, to allow detection of inclusions.

By observation of the transmission image, since visible light is not transmitted at the sections where inclusions are present, the sections where visible light is not transmitted may be detected as inclusions. According to elemental analysis by EDX or WDX, when a Si/Cr-based solvent or Si/Cr/Ni-based solvent is used as the Si—C solution, for example, it is analyzed whether solvent components other than Si and C, such as Cr or Ni, are present in the grown crystal, and the solvent components other than Si and C, such as Cr or Ni, can be detected as inclusions.

The invention is also a method for producing a SiC single crystal by a solution process in which a seed crystal substrate held on a seed crystal holding shaft is contacted with a Si—C solution having a temperature gradient in which the temperature decreases from the interior toward the surface, to cause crystal growth of the SiC single crystal, the method comprising lowering the temperature of the Si—C solution at the outer peripheral section directly below the interface with the crystal growth plane to be lower than the temperature of the Si—C solution at the center section directly below the interface with the crystal growth plane, and causing the Si—C solution to flow from the center section to the outer peripheral section directly below the interface with the crystal growth plane.

According to this method it is possible to grow a SiC single crystal with a concave crystal growth plane while preventing pooling of the Si—C solution and allowing continued flow so that the solute can continue to be sufficiently and stably supplied over the entire growth interface of the crystal, and to obtain a SiC single crystal containing no inclusions through the entire grown crystal.

This method includes controlling the temperature of the Si—C solution so that the temperature of the Si—C solution at the outer peripheral section directly below the interface with the crystal growth plane is lower than the temperature of the Si—C solution at the center section directly below the interface with the crystal growth plane, and causing the Si—C solution to flow from the center section to the outer peripheral section directly below the interface with the crystal growth plane. The timing for initiating and terminating temperature control and flow of the Si—C solution are not limited and may be the same or different. For example, temperature control and flow of the Si—C solution may be initiated simultaneously with or immediately after contact of the seed crystal substrate with the Si—C solution, and temperature control and flow of the Si—C solution may be terminated simultaneously with cutting of the seed crystal substrate from the Si—C solution and termination of growth. Alternatively, the seed crystal substrate may be contacted with the Si—C solution, temperature control of the Si—C solution may be then performed, and flow of the Si—C solution may be then performed.

The method for producing a SiC single crystal according to the invention comprises lowering the temperature of the Si—C solution at the outer peripheral section directly below the interface with the crystal growth plane to be lower than the temperature of the Si—C solution at the center section directly below the interface with the crystal growth plane. By lowering the temperature of the Si—C solution at the outer peripheral section to be lower than the temperature of the Si—C solution at the center section directly below the crystal growth interface, it is possible to increase the degree of supersaturation of the Si—C solution at the outer peripheral section to above the degree of supersaturation of the Si—C solution at the center section. By thus forming a gradient for the degree of supersaturation in the horizontal direction within the Si—C solution directly below the crystal growth interface, a SIC crystal can be grown having a concave crystal growth plane. This allows crystal growth without the crystal growth plane of the SiC single crystal being on the just plane, and can minimize generation of inclusions. The temperature of the Si—C solution and the temperature of the grown crystal are substantially the same at the interface of crystal growth, and for this method, control of the temperature of the Si—C solution directly below the interface is substantially the same as control of the temperature on the grown crystal surface.

The method for forming a temperature gradient in which the temperature of the Si—C solution is lower at the outer peripheral section than at the center section directly below the interface with the crystal growth plane may be a meniscus growth method wherein crystal growth is performed while forming a meniscus between the seed crystal substrate and the Si—C solution, a heat loss control method using a seed crystal holding shaft with higher thermal conductivity at the side sections than at the center section, or a method in which gas is blown from the outer peripheral side of the grown crystal.

Figure 3:
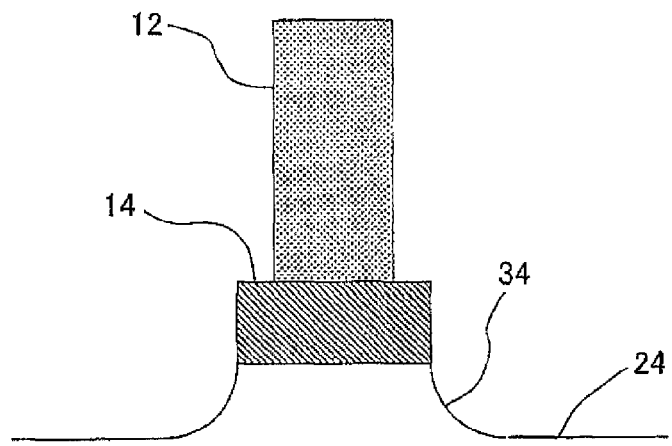
FIG. 3 is a cross-sectional schematic drawing of a meniscus formed between a seed crystal substrate and a Si—C solution.

As used herein, "meniscus" refers to a concave curved surface formed on the surface of the Si—C solution raised by surface tension upon wetting of the seed crystal substrate, as shown in FIG. 3. A meniscus growth method is a method in which the SiC single crystal is grown while forming a meniscus between the seed crystal substrate and the Si—C solution. To form a meniscus, for example, after the seed crystal substrate has been contacted with the Si—C solution, the seed crystal substrate may be raised and held at a position where the bottom face of the seed crystal substrate is higher than the liquid surface of the Si—C solution.

Since the meniscus portion formed on the outer peripheral section of the growth interface is at a lower temperature due to radiation heat loss, formation of the meniscus can create a temperature gradient in which the temperature of the Si—C solution is lower at the outer peripheral section than at the center section directly below the interface with the crystal growth plane. This can increase the degree of supersaturation of the Si—C solution at the outer peripheral section of the growth interface, so that it is greater than the degree of supersaturation of the Si—C solution at the center section of the growth interface.

Placement of the seed crystal substrate in the single crystal production apparatus may be performed by holding the top face of the seed crystal substrate on the seed crystal holding shaft using an adhesive or the like.

Generally, a seed crystal holding shaft may be a graphite shaft that holds the seed crystal substrate on one end face, and a commonly used graphite shaft may be used as the seed crystal holding shaft for the invention as well. The seed crystal holding shaft may have any desired shape, such as cylindrical or columnar, and there may be used a graphite shaft having the same end face shape as the top face of the seed crystal.

According to the invention, a seed crystal holding shaft having a constitution in which the side sections exhibit higher thermal conductivity than the center section may be used instead of a commonly used graphite shaft as described above. By using a seed crystal holding shaft wherein the thermal conductivity differs at the side sections and the center section, it is possible to control the degree of heat loss through the seed crystal holding shaft in the direction of the diameter of the seed crystal holding shaft.

Figure 4:
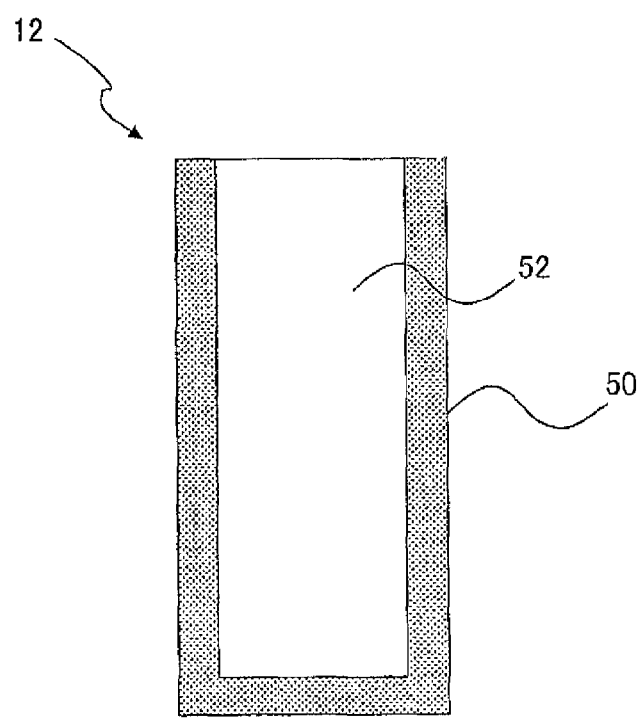
FIG. 4 is a cross-sectional schematic drawing of a seed crystal holding shaft having a constitution in which the thermal conductivity of the center section is smaller than the thermal conductivity of the side section.

A seed crystal holding shaft having a constitution in which the side sections exhibit higher thermal conductivity than the center section may have a constitution as shown in FIG. 4, where the thermal conductivity at the side sections 50 is higher than the thermal conductivity at the center section 52. By using a seed crystal holding shaft having such a constitution, it is possible to vary the degree of heat loss through the seed crystal holding shaft in the direction of the diameter of the seed crystal holding shaft, and to promote heat loss more at the outer peripheral sections than at the center section of the Si—C solution directly below the interface of the grown crystal. Therefore, the temperature of the Si—C solution at the outer peripheral sections directly below the crystal growth interface may be lower than the temperature of the Si—C solution at the center section directly below the crystal growth interface, and the degree of supersaturation of the Si—C solution at the outer peripheral sections directly below the crystal growth interface may be greater than the degree of supersaturation of the Si—C solution at the center section directly below the crystal growth interface.

The seed crystal holding shaft having a different thermal conductivity at the side sections 50 and the center section 52, shown in FIG. 4, may also be hollow at the center section 52. A hollow construction at the center section 52 can lower the thermal conductivity of the center section 52 with respect to the thermal conductivity at the side sections 50.

Figure 5:
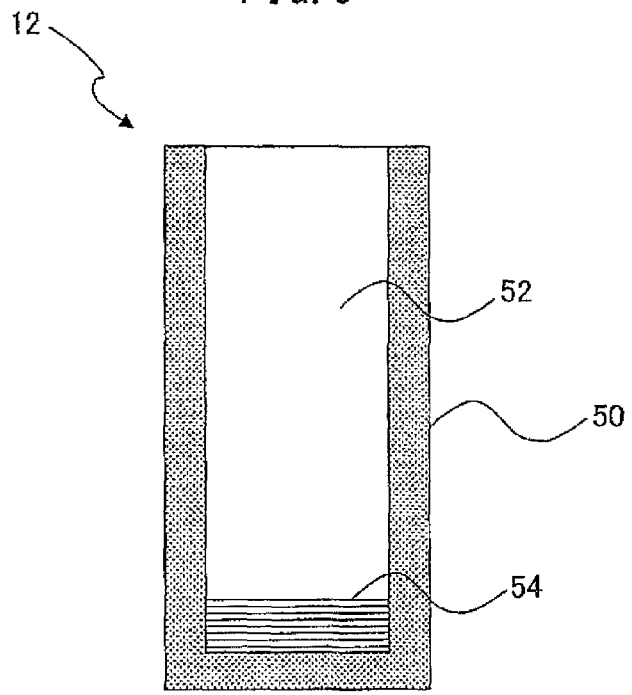
FIG. 5 is a cross-sectional schematic drawing of a seed crystal holding shaft wherein a heat-insulating material is disposed in the hollow part of the center section.

When the center section 52 has a hollow construction, a heat-insulating material may be situated in at least part of the hollow part. For example, as shown in FIG. 5, a heat-insulating material 54 may be placed at the bottom part of the center section 52, to further increase the difference in thermal conductivity between the side sections 50 and the center section 52 of the seed crystal holding shaft 12. The heat-insulating material 54 may occupy the entire center section 52.

Figure 6:
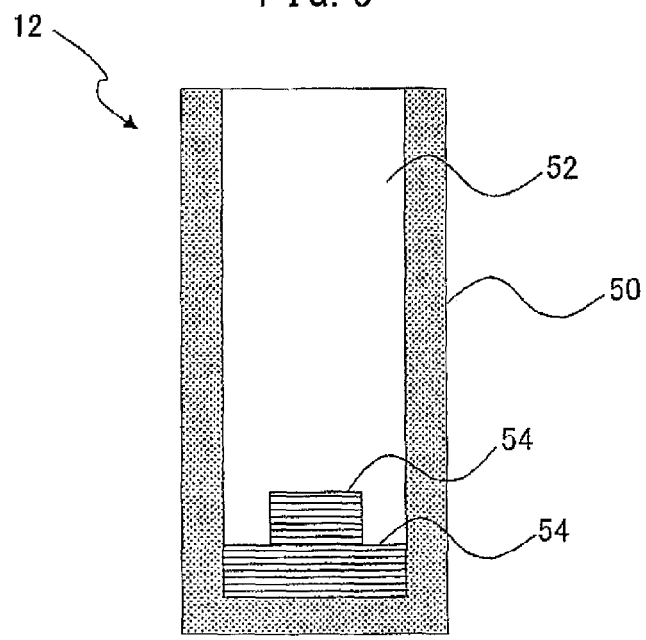
FIG. 6 is a cross-sectional schematic drawing of a seed crystal holding shaft wherein two heat-insulating materials are disposed in layers in the hollow part of the center section.
Figure 7:
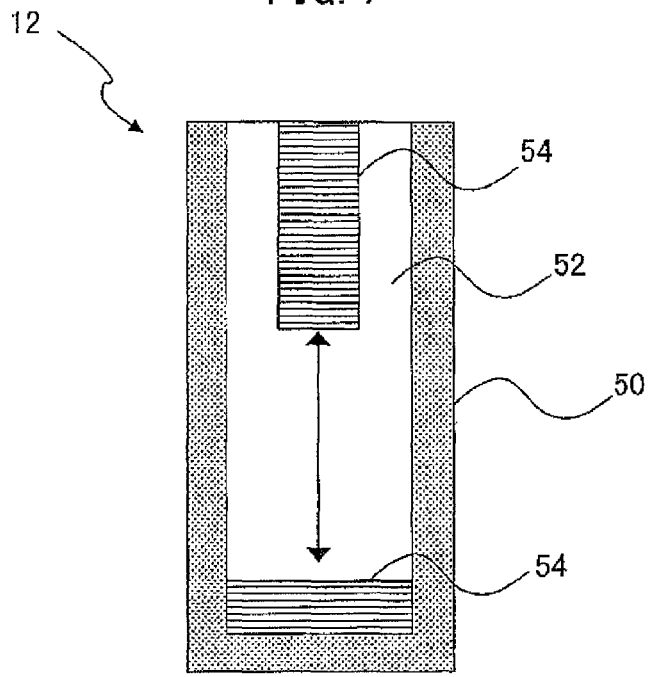
FIG. 7 is a cross-sectional schematic drawing of a seed crystal holding shaft wherein two heat-insulating materials are disposed separately in the hollow part of the center section.

When the center section 52 has a hollow construction, two or more heat-insulating materials may be situated in the hollow part. The two or more heat-insulating materials may be made of the same material and/or have the same shape, or made of different materials and/or have different shapes. When two or more heat-insulating materials are used, the two or more heat-insulating materials may be situated at any desired location, and as shown in FIG. 6, heat-insulating materials 54 may be stacked at the bottom part of the center section 52. When heat-insulating materials 54 are situated as shown in FIG. 6, it is easier to produce the desired slope of thermal conductivity between the center section 50 and the side section 52, and easier to adjust the slope of the concave crystal growth plane. When two or more heat-insulating materials are used, the heat-insulating materials 54 may be situated separately. For example, as shown in FIG. 7, the heat-insulating materials 54 may be situated separately at the bottom part and top part of the center section 52, raising and lowering the upper heat-insulating material to change the thermal conductivity of the center section 52.

The heat-insulating material used may be a graphite-based heat-insulating material, carbon fiber-molded heat-insulating material, or anisotropic heat-insulating material, such as pyrolytic graphite (PG). When an anisotropic heat-insulating material is used, since the anisotropic heat-insulating material has anisotropic thermal conductivity, the anisotropic heat-insulating material may be disposed at an orientation such that heat conduction is inhibited in the axial direction of the seed crystal holding shaft and heat conduction is promoted in the direction of the diameter of the seed crystal holding shaft.

Figure 8:
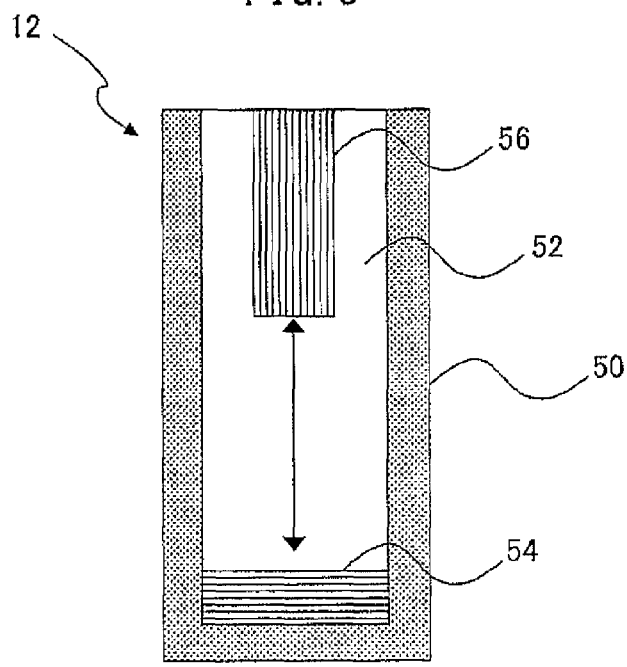
FIG. 8 is a cross-sectional schematic drawing of a seed crystal holding shaft wherein a heat-insulating material and a high thermal conductivity material are disposed in the hollow part of the center section.

When the center section 52 of the seed crystal holding shaft 12 has a hollow construction, a high thermal conductivity material may be disposed together with the heat-insulating material in the hollow part. For example, as shown in FIG. 8, a heat-insulating material 54 may be disposed at the bottom part at the center section 52 and a high thermal conductivity material 56 may be disposed at the top part of the center section 52. The position of the high thermal conductivity material may be raised and lowered to change the thermal conductivity of the center section 52. A metal with a high melting point, such as molybdenum or tantalum, may be used as the high thermal conductivity material.

A seed crystal holding shaft having a constitution in which the side sections exhibit higher thermal conductivity than the center section may have a constitution in which the thermal conductivity at the center section is preferably ½ to ¹⁄₂₀ and more preferably ⅕ to ¹⁄₁₀ with respect to the thermal conductivity of the side section.

The seed crystal holding shaft 12 may be constructed of a material such that the material composing the center section 52 has lower thermal conductivity than the material composing the side section 50, or alternatively, it may have a constitution in which at least parts of the side sections 50 and center section 52 of the seed crystal holding shaft differ in thermal conductivity in a range allowing heat loss to proceed further at the outer peripheral sections than at the center section of the Si—C solution directly below the interface of the grown crystal.

The method for producing a SiC single crystal according to the invention comprises creating a flow of the Si—C solution from the center section to the outer peripheral section directly below the interface with the crystal growth plane. By creating a flow of the Si—C solution from the center section to the outer peripheral section directly below the crystal growth interface, pooling of the Si—C solution can be minimized, and it is possible to stably supply solute to the entire growth interface including the outer peripheral section while supplying solute to the center section that has slower growth of the concave crystal growth plane, and to obtain a SiC single crystal having a concave crystal growth plane and containing no inclusions.

Flow of the Si—C solution from the center section to the outer peripheral section directly below the interface with the crystal growth plane can be performed by causing the Si—C solution to flow from the depth of the Si—C solution toward the crystal growth plane, and further causing the Si—C solution to flow from the center section to the outer peripheral section, creating a flow such that the Si—C solution circulates from the outer peripheral section to the depth.

The method for creating a flow of the Si—C solution from the center section to the outer peripheral section directly below the interface with the crystal growth plane may be mechanical stirring or electrical magnetic stirring by high-frequency heating of the Si—C solution. The present inventors have discovered a method in which the seed crystal substrate is rotated continuously in a fixed direction at a prescribed speed for at least a prescribed period of time, as a preferred method for creating a flow of the Si—C solution from the center section to the outer peripheral section directly below the interface with the crystal growth plane.

The present inventors have found that by rotating the seed crystal substrate continuously in a fixed direction at a prescribed speed for at least a prescribed period of time, it is possible to promote flow of the Si—C solution directly below the crystal growth interface, and in particular to eliminate stagnated flow sections of the Si—C solution at the outer peripheral sections and minimize incorporation of solution (inclusions) at the outer peripheral sections.

Throughout the present specification, the rotational speed of the seed crystal substrate is the speed at the outermost periphery of the growth surface (bottom face) of the seed crystal substrate (also referred to herein as the outer peripheral section or outermost periphery of the seed crystal substrate). The speed at the outer peripheral section of the seed crystal substrate is preferably a speed that is greater than 25 mm/sec, more preferably at least 45 mm/sec and even more preferably at least 63 mm/sec. Limiting the speed at the outer peripheral section of the seed crystal substrate to within the aforementioned range will make it easier to minimize inclusions.

When the speed at the outer peripheral section of the seed crystal substrate is controlled to grow the SiC single crystal, the grown crystal will usually grow so as to have the same diameter or an enlarged diameter with respect to the growth surface of the seed crystal substrate. Therefore the rotational speed at the outer peripheral section of the grown crystal will be the same as or greater than the speed at the outer peripheral section of the seed crystal substrate. Thus, controlling the speed at the outer peripheral section of the seed crystal substrate to within the aforementioned range allows flow of the Si—C solution to continue directly below the grown crystal even when crystal growth has proceeded.

According to the invention, the speed at the outer peripheral section of the grown crystal may be controlled to within the aforementioned speed range, instead of controlling the speed at the outer peripheral section of the seed crystal substrate. As growth of the SiC single crystal proceeds, the grown crystal generally grows in a manner such that its diameter is the same or an enlarged diameter with respect to the growth surface of the seed crystal substrate, resulting in an increasing speed at the outer peripheral section of the grown crystal. In that case, the revolutions per minute (rpm) may be maintained, or the revolutions per minute (rpm) may be reduced so that the speed at the outer peripheral section of the grown crystal is constant.

The method of the invention comprises rotating the seed crystal substrate so that flow of the Si—C solution is promoted in the aforementioned manner. It is not necessary to rotate a crucible. This does not exclude an embodiment of rotating a crucible, and a crucible may be rotated together with the seed crystal substrate in a range in which the aforementioned rotational speed at the outer peripheral section of the seed crystal substrate is obtained relative to the Si—C solution flowing by rotation of the crucible.

The present inventors have found that when the rotational direction of the seed crystal substrate is periodically switched, setting the time of rotation of the seed crystal substrate in the same direction (the rotation holding time) to be longer than a prescribed time period can stabilize the solution flow and minimize incorporation of the solution into the outer peripheral sections.

By periodically changing the rotational direction of the seed crystal substrate, it is possible to grow a concentric SiC single crystal, and to minimize generation of defects that may be generated in the grown crystal. In that case, by keeping rotation in the same direction for a prescribed period of time or longer, it is possible to stabilize flow of the Si—C solution directly below the crystal growth interface. If the rotation holding time is too short, switching of the rotational direction will become too frequent, and this may render flow of the Si—C solution insufficient or unstable.

When the rotational direction of the seed crystal substrate is periodically changed, the rotation holding time in the same direction is preferably longer than 30 seconds, more preferably 200 seconds or longer and even more preferably 360 seconds or longer. Limiting the rotation holding time in the same direction of the seed crystal substrate to within the aforementioned range will make it even easier to minimize inclusions.

When the rotational direction of the seed crystal substrate is periodically changed, a shorter time for the stopping time of the seed crystal substrate during switching of the rotational direction in the reverse direction is desired, and it is preferably no greater than 10 seconds, more preferably no greater than 5 seconds, even more preferably no greater than 1 second and yet more preferably substantially 0 seconds.

The seed crystal substrate that can be used in this method may be, for example, a SiC single crystal that has been normally grown by a sublimation process. It is preferred to use a SiC single crystal having a flat growth surface and having a (0001) just plane or (000-1) just plane, or a SiC single crystal having a concave growth surface and having a (0001) face or (000-1) face at a section near the center section of the concave growth surface. The overall shape of the seed crystal substrate may be any desired shape, such as plate-like, discoid, cylindrical, columnar, truncated conic or truncated pyramidal.

The invention is also an apparatus for production of a SiC single crystal by a solution process in which a seed crystal substrate held on a seed crystal holding shaft is contacted with a Si—C solution heated so as to have a temperature gradient such that the temperature decreases from the interior toward the surface, to cause crystal growth of the SiC single crystal from the seed crystal substrate, comprising:

a crucible that houses a Si—C solution, a heating device situated surrounding the crucible, and a seed crystal holding shaft situated in a movable manner in the up-down direction, the apparatus further comprising:

a temperature control means that lowers the temperature of the Si—C solution at the outer peripheral section directly below the interface with the crystal growth plane to be lower than the temperature of the Si—C solution at the center section directly below the interface with the crystal growth plane, and a flow means that causes the Si—C solution to flow from the center section directly below the interface with the crystal growth plane to the outer peripheral section directly below the interface with the crystal growth plane.

The apparatus for producing a SiC single crystal according to the invention comprises a temperature control means that lowers the temperature of the Si—C solution at the outer peripheral section directly below the interface with the crystal growth plane to be lower than the temperature of the Si—C solution at the center section directly below the interface with the crystal growth plane. The temperature control means may be the aforementioned method in which a meniscus is formed, a method in which a seed crystal holding shaft having a constitution with different thermal conductivities is used, or a method in which gas is blown from the outer peripheral side of the crystal.

The apparatus for producing a SiC single crystal according to the invention also comprises a flow means that creates a flow of the Si—C solution from the center section to the outer peripheral section directly below the interface with the crystal growth plane. The flow means may be mechanical stirring or electrical magnetic stirring by high-frequency heating. It is preferred to use a method in which the seed crystal substrate is continuously rotated in a fixed direction at a prescribed speed for at least a prescribed period of time.

The content described for the method of the invention is applied to the constitution of this apparatus.

As used herein, a Si—C solution is a solution in which C is dissolved, where the solvent is a molten liquid of Si or Si/X (X is one or more metals other than Si). X is not particularly restricted so long as it is one or more metals and can form a liquid phase (solution) that is in a state of thermodynamic equilibrium with SiC (solid phase). Suitable examples of X metals include Ti, Mn, Cr, Ni, Ce, Co, V and Fe.

The Si—C solution is preferably a Si—C solution wherein the solvent is a molten liquid of Si/Cr/X (where X represents one or more metals other than Si and Cr). A Si—C solution wherein the solvent is a molten liquid with an atomic composition percentage of Si/Cr/X=30-80/20-60/0-10, has low variation in C dissolution and is therefore preferred. For example, Cr, Ni and the like may be loaded into the crucible in addition to Si, to form a Si—Cr solution, Si—Cr—Ni solution or the like.

The Si—C solution preferably has a surface temperature of 1800° C. to 2200° C., which will minimize fluctuation in the amount of dissolution of C into the Si—C solution.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

Figure 9:
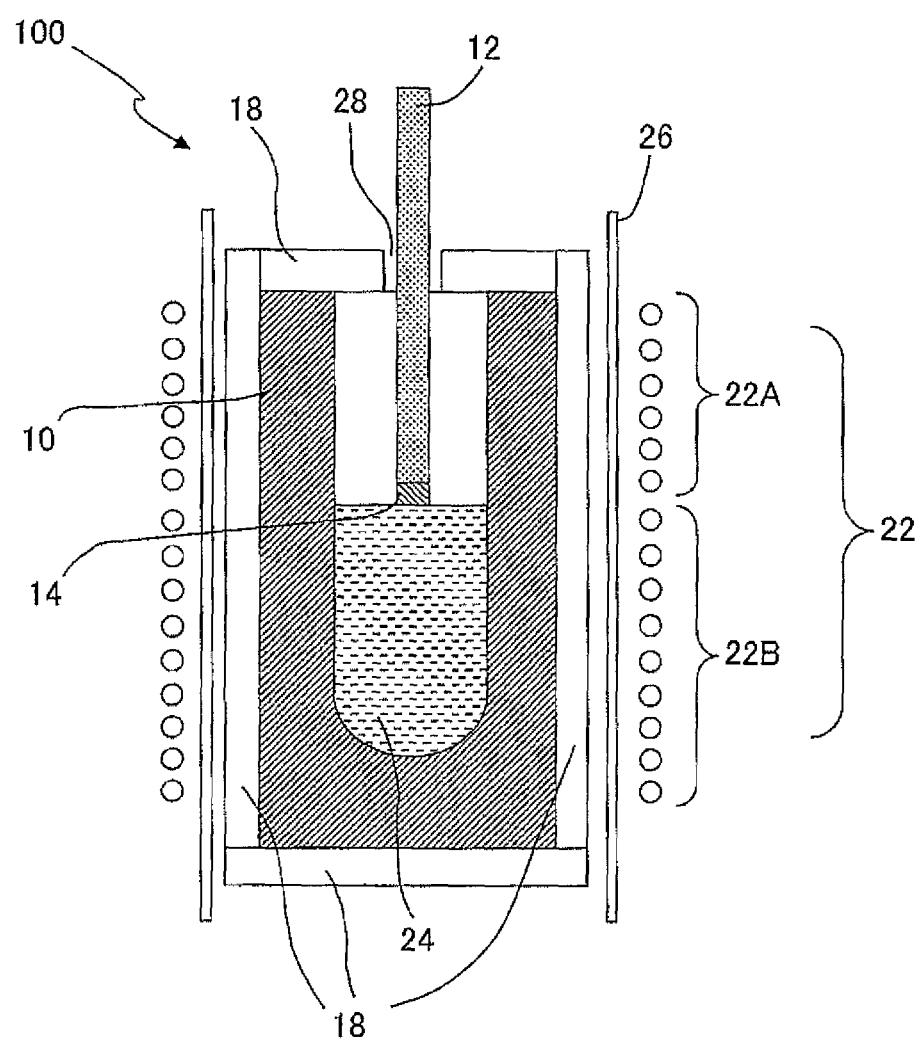
FIG. 9 is a cross-sectional schematic drawing representing an example of a single crystal production apparatus based on a solution process, to be used for the invention.

FIG. 9 shows an example of a SiC single crystal production apparatus for carrying out the invention. The illustrated SiC single crystal production apparatus 100 comprises a crucible 10 that receives a Si—C solution 24 having C dissolved in a molten liquid of Si or Si/X, wherein a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14.

The Si—C solution 24 is prepared by loading the starting materials into the crucible, melting them by heating to prepare Si or Si/X molten liquid, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC by deposition of the SiC single crystal onto the undissolved C. The supply of C may be performed by utilizing a method of, for example, blowing in hydrocarbon gas or loading a solid C source together with the molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be constructed from an upper level coil 22A and a lower level coil 22B, the upper level coil 22A and lower level coil 22B each being independently controllable.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The crucible 10 comprises an opening 28 at the top through which the seed crystal holding shaft 12 passes, and it is possible to vary the amount of radiation heat loss from the surface of the Si—C solution 24 by adjusting the gap (spacing) between the crucible 10 and the seed crystal holding shaft 12 at the opening 28. Although it is usually necessary to keep the interior of the crucible 10 at high temperature, setting a large gap between the crucible 10 and the seed crystal holding shaft 12 at the opening 28 can increase radiation heat loss from the surface of the Si—C solution 24, while setting a small gap between the crucible 10 and the seed crystal holding shaft 12 at the opening 28 can reduce radiation heat loss from the surface of the Si—C solution 24. When a meniscus is formed, radiation heat loss can take place from the meniscus portion as well.

The temperature of the Si—C solution usually has a temperature distribution with a lower temperature at the surface than the interior of the Si—C solution due to radiation and the like. Further, a temperature gradient can be formed in the Si—C solution 24 in the direction perpendicular to the surface of the Si—C solution 24 so that an upper portion of the solution contacting the seed crystal substrate 14 is at low temperature and a lower portion of the solution (the interior) is at high temperature, by adjusting the number of coils and spacing of the high-frequency coil 22, the positional relationship of the high-frequency coil 22 and the crucible 10 in the direction of height, and the output of the high-frequency coil. For example, the output of the upper level coil 22A may be smaller than the output of the lower level coil 22B, to form a temperature gradient in the Si—C solution 24 in which an upper portion of the solution is at low temperature and a lower portion of the solution is at high temperature. The temperature gradient is preferably 1-100° C./cm and more preferably 10-50° C./cm, in a range of a depth of up to, for example, 30 mm from the solution surface.

The C that has dissolved in the Si—C solution 24 is dispersed by diffusion and convection. In the region near the bottom face of the seed crystal substrate 14, a temperature gradient can be formed so that it is at lower temperature than the interior of the Si—C solution 24, due to control of output from the heating device, heat radiation from the surface of the Si—C solution 24 and heat loss through the seed crystal holding shaft 12. When the C that has dissolved into the solution interior that is at high temperature and has high solubility reaches the region near the seed crystal substrate that is at low temperature and has low solubility, a supersaturated state appears and a SiC single crystal is grown on the seed crystal substrate 14 by virtue of supersaturation as a driving force.

In some embodiments, meltback may be carried out in which the surface layer of the seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of these by dissolution prior to growth of a SiC single crystal is effective for growing a high-quality SiC single crystal. Although the thickness of a layer to be dissolved depends on processed conditions of the surface of a seed crystal substrate, it is preferably about 5 to 50 μm for sufficient removal of an affected layer and a natural oxide film.

The meltback may be performed by forming in the Si—C solution a temperature gradient in which the temperature increases from the interior of the Si—C solution toward the surface of the solution, i.e. by forming a temperature gradient in a direction opposite to the case of SiC single crystal growth. The temperature gradient in the opposite direction can be formed by controlling the output of the high-frequency coil.

The meltback can also be performed without forming a temperature gradient in the Si—C solution, by simply immersing the seed crystal substrate in the Si—C solution that has been heated to a temperature higher than the liquidus temperature. In that case, the dissolution rate increases with higher Si—C solution temperature, but control of the amount of dissolution becomes difficult, while a low temperature may slow the dissolution rate.

In some embodiments, the seed crystal substrate may be preheated in advance, and then the same is contacted with the Si—C solution. If the seed crystal substrate at a low temperature is contacted with the Si—C solution at high temperature, heat shock dislocation may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In that case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal with the Si—C solution at a relatively low temperature. This is also effective for preventing heat shock dislocations and growing a high-quality SiC single crystal.

EXAMPLES (Common Conditions)

The conditions common to the examples and comparative examples will now be described. For each example, a single crystal production apparatus 100, such as shown in FIG. 9, was used. In a graphite crucible 10 with an inner diameter of 70 mm and a height of 125 mm containing a Si—C solution 24 there were charged Si/Cr/Ni in an atomic compositional ratio of 56:40:4, as a molten liquid starting material. The air in the single crystal production apparatus was exchanged with argon. A high-frequency coil 22 situated around the periphery of the graphite crucible 10 was electrified to melt the starting material in the graphite crucible 10 by heating, thereby forming a Si/Cr/Ni alloy molten liquid. A sufficient amount of C was dissolved into the Si/Cr/Ni alloy molten liquid from the graphite crucible 10 to form a Si—C solution 24.

The outputs of the upper level coil 22A and lower level coil 22S were adjusted to heat the graphite crucible 10, forming a temperature gradient in which the temperature decreased from the interior of the Si—C solution 24 toward the surface of the solution. Formation of the prescribed temperature gradient was confirmed by using a vertically movable thermocouple comprising a zirconia-coated tungsten-rhenium wire placed in a graphite protection tube, to measure the temperature of the Si—C solution 24. Output of the high-frequency coils 22A and 22S was controlled to adjust the temperature to 2000° C. on the surface of the Si—C solution 24. With the surface of the Si—C solution as the low-temperature side, the temperature difference between the temperature at the surface of the Si—C solution and the temperature at a depth of 10 mm in the vertical direction from the surface of the Si—C solution 24 toward the interior of the solution was 25° C.

Example 1

A cylindrical graphite seed crystal holding shaft 12 with a diameter of 12 mm and a length of 200 mm was prepared. A discoid 4H—SiC single crystal with a thickness of 1 mm, a diameter of 16 mm and a (000-1) just plane formed by a sublimation process was prepared and used as a seed crystal substrate 14.

The top face of the seed crystal substrate 14 was bonded to about the center section of the end face of the seed crystal holding shaft 12 by using a graphite adhesive, with the bottom face of the seed crystal substrate 14 as the (000-1) face. The seed crystal holding shaft 12 and seed crystal substrate 14 were situated so that the seed crystal holding shaft 12 passed through an opening 28 with a diameter of 20 mm, opened at the top of the crucible 10. The gap between the crucible 10 and the seed crystal holding shaft 12 at the opening 28 was 4.0 mm.

Next, the seed crystal holding shaft 12 holding the seed crystal substrate 14 was lowered, the seed crystal substrate 14 was contacted with the Si—C solution 24 so that the bottom face of the seed crystal substrate 14 matched the surface location of the Si—C solution 24, and the bottom face of the seed crystal substrate 14 was wetted with the Si—C solution 24. The seed crystal substrate 14 was then raised so that the bottom face of the seed crystal substrate 14 was positioned 1.0 mm above the liquid surface of the Si—C solution 24, forming a meniscus of the Si—C solution, and the SiC crystal was grown for 10 hours.

During the crystal growth, the seed crystal holding shaft 12 was rotated at a speed of 150 rpm so that the outer peripheral section of the bottom face of the seed crystal substrate 14 rotated at a speed of 126 mm/sec, and the rotational direction was periodically switched, with the rotation holding time during which the seed crystal substrate 14 was continuously rotated in same direction as 36,000 seconds, and the stopping time for the seed crystal substrate 14 during switching of the rotational direction as 5 seconds.

Figure 10:
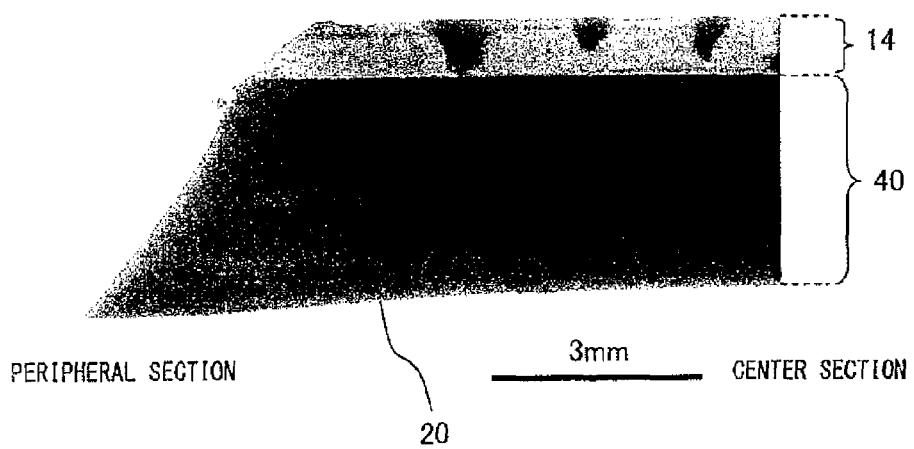
FIG. 10 is a cross-sectional photograph of the SiC single crystal ingot obtained in Example 1.

As shown in FIG. 2, the obtained SIC single crystal was cut parallel to the growth direction to a thickness of 1 mm together with the seed crystal substrate 14, so that the center section of the growth plane was included, and it was further cut in half at the center section, subjected to mirror polishing, and the cross-section of the cut grown crystal was observed under an optical microscope in transparent mode. FIG. 10 shows an optical microscope photograph of the cross-section of the obtained grown crystal.

The obtained SiC single crystal had a concave crystal growth plane 20 with a thicker grown film thickness at the outer peripheral section of the grown crystal than at the center section. The grown crystal had no visible black sections and contained no inclusions.

The maximum angle θ of the slope of the concave crystal growth plane with respect to the (000-1) just plane of the obtained grown crystal was 5.5°, the thickness of crystal growth at the concave center section was 3.3 mm, and the diameter of the growth plane of the grown crystal was 20.0 mm. The diameter of the growth plane of the grown crystal in each of the examples and comparative examples was the diameter projected onto the (000-1) just plane, and this applies to all of the diameters mentioned below.

Example 2

Crystal growth was performed under the same conditions as Example 1, except that a seed crystal substrate 14 with a 45 mm diameter was used, the gap was 3.0 mm between the crucible 10 and the seed crystal holding shaft 12 at the opening 28, the seed crystal substrate 14 was raised to a position of 3.0 mm above the liquid level of the Si—C solution 24 to form a meniscus, the seed crystal holding shaft 12 was rotated at a speed of 100 rpm for a rotational speed of 236 mm/sec at the outer peripheral section of the bottom face of the seed crystal substrate 14, the unidirectional rotational holding time of the seed crystal substrate 14 was 360 seconds, and the crystal growth time was 14 hours.

Figure 11:
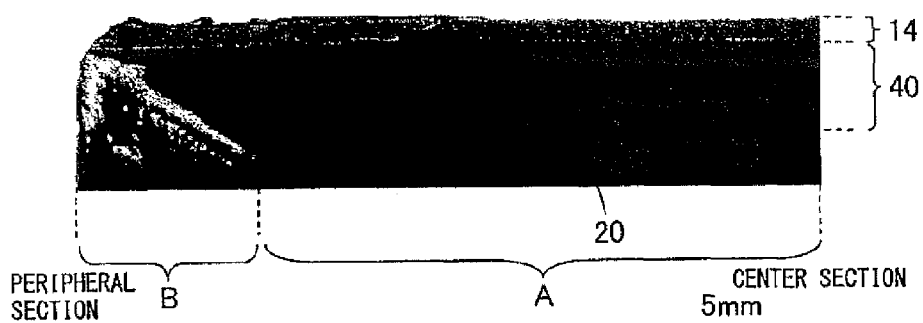
FIG. 11 is a cross-sectional photograph of the SiC single crystal ingot obtained in Example 2.

In the same manner as Example 1, a cross-section of the grown crystal was cut out together with the seed crystal substrate and subjected to mirror polishing, and the cross-section of the grown crystal was observed under an optical microscope in transparent mode. FIG. 11 shows an optical microscope photograph of the cross-section of the obtained grown crystal.

The obtained SiC single crystal had a concave crystal growth plane with a thicker grown film thickness at the outer peripheral section of the grown crystal than at the center section. The obtained SiC single crystal exhibited no black sections and contained no inclusions in region A shown in FIG. 11. The grown crystal contained inclusions in region B.

The slope angle θ of the concave crystal growth plane with respect to the (000-1) just plane of the obtained grown crystal was 8.0° at the outermost periphery of region A, while the slope angle θ was greater than 8.0° at the outer periphery side. The thickness of the crystal growth at the center section of the concave grown crystal plane was 2.7 mm, and the diameter of the growth plane in region A was 33.6 mm.

Example 3

Crystal growth was performed under the same conditions as Example 1, except that a meniscus was formed with the raised position of the seed crystal substrate 14 at 1.7 mm from the liquid surface of the Si—C solution 24, the unidirectional rotational holding time of the seed crystal substrate was 7200 seconds, and the crystal growth time was 2 hours.

In the same manner as Example 1, a cross-section of the grown crystal was cut out and subjected to mirror polishing, and observed under an optical microscope in transparent mode.

The obtained SiC single crystal had a concave crystal growth plane 20 with a thicker grown film thickness at the outer peripheral section of the grown crystal than at the center section. The grown crystal had no visible black sections and contained no inclusions.

The maximum angle θ of the slope of the concave crystal growth plane with respect to the (000-1) just plane of the obtained grown crystal was 2.0°. The thickness of the crystal growth at the center section of the crystal growth plane was 1.2 mm, and the diameter of the growth plane of the grown crystal was 15.6 mm.

Example 4

Crystal growth was performed under the same conditions as Example 1, except that a meniscus was formed with the raised position of the seed crystal substrate 14 at 1.3 mm from the liquid surface of the Si—C solution 24, the rotational speed of the seed crystal holding shaft was 120 rpm so that the circumferential speed of the seed crystal substrate was 101 mm/s, the unidirectional rotational holding time was 360 seconds, and the crystal growth time was 20 hours.

In the same manner as Example 1, a cross-section of the grown crystal was cut out and subjected to mirror polishing, and observed under an optical microscope in transparent mode.

The obtained SiC single crystal had a concave crystal growth plane 20 with a thicker grown film thickness at the outer peripheral section of the grown crystal than at the center section. The grown crystal had no visible black sections and contained no inclusions.

The maximum angle θ of the slope of the concave crystal growth plane with respect to the (000-1) just plane of the obtained grown crystal was 5.7°. The thickness of the crystal growth at the center section of the crystal growth plane was 12.5 mm, and the diameter of the growth plane of the grown crystal was 30.0 mm.

Example 5

Crystal growth was performed under the same conditions as Example 1, except that a seed crystal substrate with a diameter of 12 mm was used, a meniscus was formed with the raised position of the seed crystal substrate 14 at 1.3 mm from the liquid surface of the Si—C solution 24, the rotational speed of the seed crystal holding shaft was 100 rpm so that the circumferential speed of the seed crystal substrate was 63 mm/s, the unidirectional rotational holding time was 18,000 seconds, and the crystal growth time was 5 hours.

Figure 12:
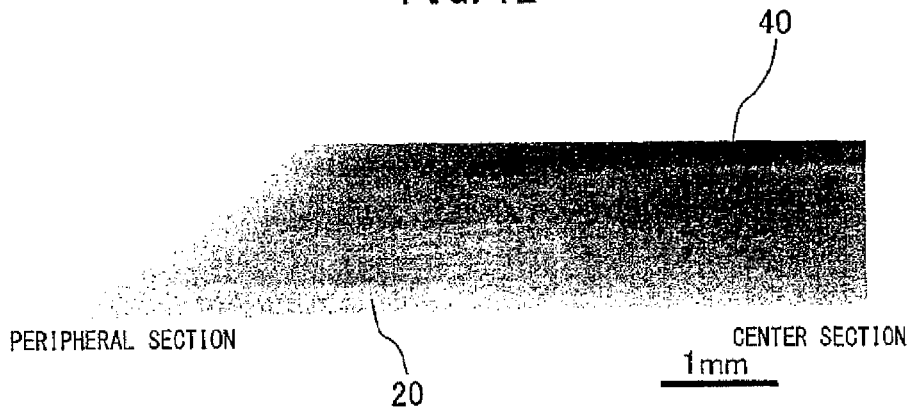
FIG. 12 is a cross-sectional photograph of the SiC single crystal obtained in Example 5.

In the same manner as Example 1, a cross-section of the grown crystal was cut out and subjected to mirror polishing, and observed under an optical microscope in transparent mode. FIG. 12 shows an optical microscope photograph of the cross-section of the obtained grown crystal.

The obtained SIC single crystal had a concave crystal growth plane 20 with a thicker grown film thickness at the outer peripheral section of the grown crystal than at the center section. The grown crystal had no visible black sections and contained no inclusions.

The maximum angle θ of the slope of the concave crystal growth plane with respect to the (000-1) just plane of the obtained grown crystal was 2.0°. The thickness of the crystal growth at the center section of the crystal growth plane was 2.3 mm, and the diameter of the growth plane of the grown crystal was 16.0 mm.

Example 6

Crystal growth was performed under the same conditions as Example 5, except that the unidirectional rotational holding time of the seed crystal substrate was 3600 seconds, and the crystal growth time was 10 hours.

In the same manner as Example 1, a cross-section of the grown crystal was cut out and subjected to mirror polishing, and observed under an optical microscope in transparent mode.

The obtained SiC single crystal had a concave crystal growth plane 20 with a thicker grown film thickness at the outer peripheral section of the grown crystal than at the center section. The grown crystal had no visible black sections and contained no inclusions.

The maximum angle θ of the slope of the concave crystal growth plane with respect to the (000-1) just plane of the obtained grown crystal was 4.0°. The thickness of the crystal growth at the center section of the crystal growth plane was 4.5 mm, and the diameter of the growth plane of the grown crystal was 26.0 mm.

Example 7

Crystal growth was performed under the same conditions as Example 5, except that a meniscus was formed with the raised position of the seed crystal substrate 14 at 1.5 mm from the liquid surface of the Si—C solution 24, the unidirectional rotational holding time of the seed crystal substrate was 360 seconds, and the crystal growth time was 30 hours.

In the same manner as Example 1, a cross-section of the grown crystal was cut out and subjected to mirror polishing, and observed under an optical microscope in transparent mode.

The obtained SiC single crystal had a concave crystal growth plane 20 with a thicker grown film thickness at the outer peripheral section of the grown crystal than at the center section. The grown crystal had no visible black sections and contained no inclusions.

The maximum angle θ of the slope of the concave crystal growth plane with respect to the (000-1) just plane of the obtained grown crystal was 6.0°. The thickness of the crystal growth at the center section of the crystal growth plane was 2.5 mm, and the diameter of the growth plane of the grown crystal was 19.0 mm.

Comparative Example 1

Crystal growth was performed under the same conditions as Example 1, except that a seed crystal substrate 14 with a diameter of 25 mm was used, the gap was 1.5 mm between the crucible 10 and the seed crystal holding shaft 12 at the opening 28, the raised position after contact of the bottom face of the seed crystal substrate 14 with the Si—C solution 24 was 1.3 mm, during crystal growth the seed crystal holding shaft 12 was rotated at a speed of 40 rpm so that the outermost peripheral section of the bottom face of the seed crystal substrate 14 was rotated at a speed of 52 mm/sec, while the crucible 10 was simultaneously rotated in the same direction at 5 rpm, the rotation holding time during which the seed crystal substrate was rotated continuously in the same direction was 15 seconds, the rotational direction was periodically switched with a stopping time of 5 seconds for the seed crystal holding shaft 12 during switching of the rotational direction, and the crystal growth time was 18 hours.

Figure 13:
FIG. 13 is a cross-sectional photograph of an ingot of the SiC grown crystal obtained in Comparative Example 1.

As shown in FIG. 2, the obtained SiC crystal was cut parallel to the growth direction to a thickness of 1 mm so that the center section of the growth plane was included, it was subjected to mirror polishing, and the cross-section of the cut grown crystal was observed under an optical microscope in transparent mode. FIG. 13 shows an optical microscope photograph of the obtained grown crystal.

The obtained SiC crystal had a somewhat convex growth plane with numerous small irregularities. Discontinuous steps were observed throughout the grown crystal, and inclusions were found at the step sections.

The maximum angle θ of the slope of the crystal growth plane with respect to the (000-1) just plane of the obtained grown crystal was −0.6°. The thickness of the crystal growth at the center section of the crystal growth plane was 8.0 mm, and the diameter of the growth plane of the grown crystal was 35.0 mm.

Figure 14:
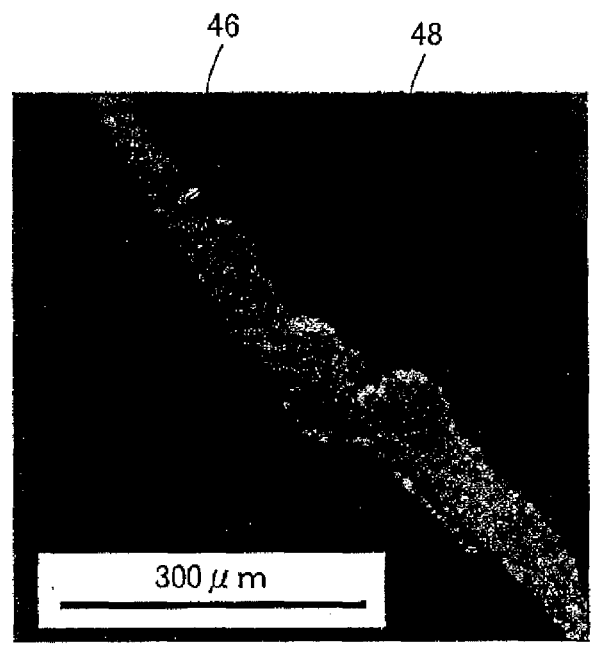
FIG. 14 is a backscattered electron image of the cross-section of the SiC grown crystal obtained in Comparative Example 1.

FIG. 14 shows a backscattered electron image of a cross-section of the obtained grown crystal, as observed by EDX (EMAX, product of Horiba, Ltd.). From the backscattered electron image it is seen that a region 46 considered to be inclusions was present in the obtained SiC single crystal. The region 46 and the region 48 considered to be the SiC single crystal were subjected to quantitative analysis for Si and Cr by EDX. The region 48 had a Cr/Si ratio of 0, while Cr was detected in the region 46 at a ratio of Cr/Si=1.3 in terms of atomic compositional ratio, confirming that inclusions were present in the grown crystal. The Cr/Si ratio of the charged Si—C solution was 0.7, and Cr was detected at a ratio more than this ratio in the inclusions in the obtained grown crystal for this example.

Comparative Example 2

The seed crystal holding shaft 12 was inserted through the opening 28 formed at the top of the crucible 10, a heat-insulating material with a thickness of 20 mm was placed in the opening 28, and the gap between the crucible 10 and the seed crystal holding shaft 12 in the opening 28 was 0.5 mm, so as to reduce radiation heat loss from the Si—C solution surface while substantially maintaining heat loss through the seed crystal holding shaft 12, Crystal growth was performed under the same conditions as Example 7, except that the bottom face of the seed crystal substrate 14 was contacted with the Si—C solution 24 and held at the same height as the liquid surface of the Si—C solution 24, and the crystal growth time was 5 hours.

Figure 15:
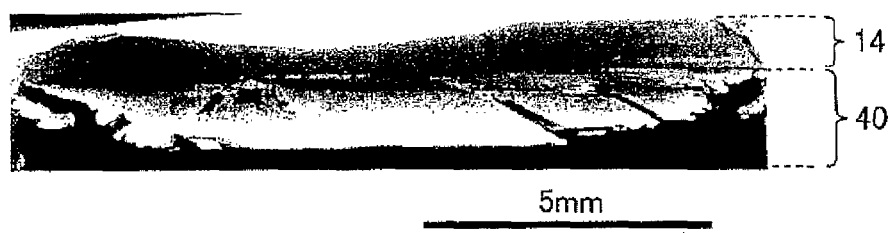
FIG. 15 is a cross-sectional photograph of an ingot of the SiC grown crystal obtained in Comparative Example 2.

In the same manner as Comparative Example 1, a cross-section of the obtained SiC grown crystal was cut out and subjected to mirror polishing, and observed under an optical microscope in transparent mode. FIG. 15 shows an optical microscope photograph of the obtained grown crystal.

The obtained SiC crystal had a convex crystal growth plane. Also, inclusions were found at locations where differences in growth were present in the grown crystal.

The maximum angle θ of the slope of the crystal growth plane with respect to the (000-1) just plane of the obtained grown crystal was −14.4°. The thickness of the crystal growth at the center section of the crystal growth plane was 1.7 mm, and the diameter of the growth plane of the grown crystal was 12.0 mm.

Comparative Example 3

Crystal growth was performed under the same conditions as Example 7, except that a seed crystal substrate with a diameter of 16 mm was used, the gap between the crucible 10 and the seed crystal holding shaft 12 at the opening 28 was 2.0 mm, and the crystal growth time was 10 hours.

Figure 16:
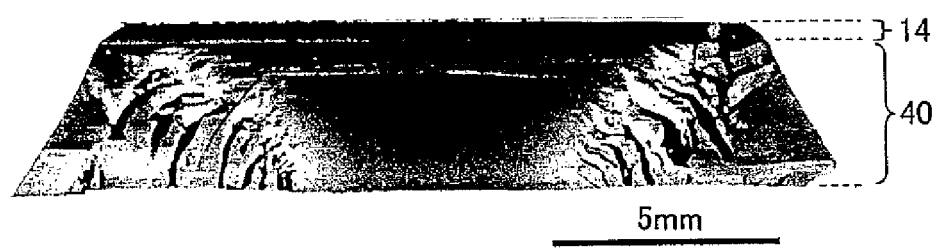
FIG. 16 is a cross-sectional photograph of an ingot of the SiC grown crystal obtained in Comparative Example 3.

In the same manner as Comparative Example 1, a cross-section of the obtained SiC grown crystal was cut out and subjected to mirror polishing, and observed under an optical microscope in transparent mode. FIG. 16 shows an optical microscope photograph of the obtained grown crystal.

The obtained SiC crystal had a substantially flat crystal growth plane. Also, contaminating inclusions were found in the grown crystal.

The maximum angle θ of the slope of the crystal growth plane of the grown crystal with respect to the (000-1) just plane was 0.0°. The thickness of the crystal growth at the center section of the crystal growth plane was 3.8 mm, and the diameter of the growth plane of the grown crystal was 17.1 mm.

Comparative Example 4

Crystal growth was performed under the same conditions as Example 5, except that a meniscus was formed with the raised position of the seed crystal substrate 14 at 1.7 mm from the liquid surface of the Si—C solution 24, the rotational speed of the seed crystal holding shaft was 40 rpm so that the circumferential speed of the seed crystal substrate was 25 mm/s, and the crucible 10 was simultaneously rotated at 5 rpm in the same direction.

Figure 17:
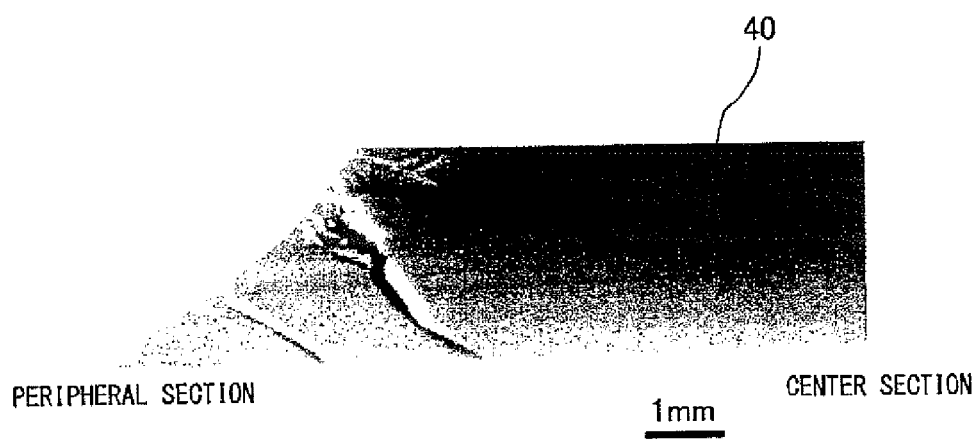
FIG. 17 is a cross-sectional photograph of the SiC grown crystal obtained in Comparative Example 4.

In the same manner as Example 1, a cross-section of the grown crystal was cut out and subjected to mirror polishing, and observed under an optical microscope in transparent mode. FIG. 17 shows an optical microscope photograph of the obtained grown crystal. The obtained SiC grown crystal had a substantially flat crystal growth plane, black sections were observed, and inclusions were present.

The maximum angle θ of the slope of the crystal growth plane with respect to the (000-1) just plane of the obtained grown crystal was −0.5°. The thickness of the crystal growth at the center section of the crystal growth plane was 2.8 mm, and the maximum diameter of the grown crystal was 16.6 mm.

Comparative Example 5

Crystal growth was performed under the same conditions as Example 5, except that a meniscus was formed with the raised position of the seed crystal substrate 14 at 1.0 mm from the liquid surface of the Si—C solution 24, the rotational speed of the seed crystal holding shaft was 40 rpm so that the circumferential speed of the seed crystal substrate was 25 mm/s, the crucible 10 was simultaneously rotated in the same direction at 5 rpm, the unidirectional rotational holding time was 15 seconds, and the crystal growth time was 10 hours.

In the same manner as Example 1, a cross-section of the grown crystal was cut out and subjected to mirror polishing, and observed under an optical microscope in transparent mode. The obtained SiC grown crystal had a substantially flat crystal growth plane, black sections were observed, and inclusions were present.

The maximum angle θ of the slope of the crystal growth plane with respect to the (000-1) just plane of the obtained grown crystal was −0.7°. The thickness of the crystal growth at the center section of the crystal growth plane was 4.7 mm, and the maximum diameter of the grown crystal was 27.5 mm.

Comparative Example 6

Crystal growth was performed under the same conditions as Example 5, except that a meniscus was formed with the raised position of the seed crystal substrate 14 at 1.0 mm from the liquid surface of the Si—C solution 24, the rotational speed of the seed crystal holding shaft was 0.4 rpm so that the circumferential speed of the seed crystal substrate was 0.3 mm/s, the unidirectional rotational holding time was 36,000 seconds, and the crystal growth time was 10 hours.

In the same manner as Example 1, a cross-section of the grown crystal was cut out and subjected to mirror polishing, and observed under an optical microscope in transparent mode. The obtained SiC grown crystal had a convex crystal growth plane, black sections were observed, and inclusions were present.

The maximum angle θ of the slope of the crystal growth plane with respect to the (000-1) just plane of the obtained grown crystal was −2.3°. The thickness of the crystal growth at the center section of the crystal growth plane was 3.1 mm, and the maximum diameter of the grown crystal was 15.0 mm.

Comparative Example 7

Crystal growth was performed under the same conditions as Example 5, except that the unidirectional rotational holding time of the seed crystal substrate was 15 seconds, and the crucible 10 was simultaneously rotated in the same direction at 5 rpm.

Figure 18:
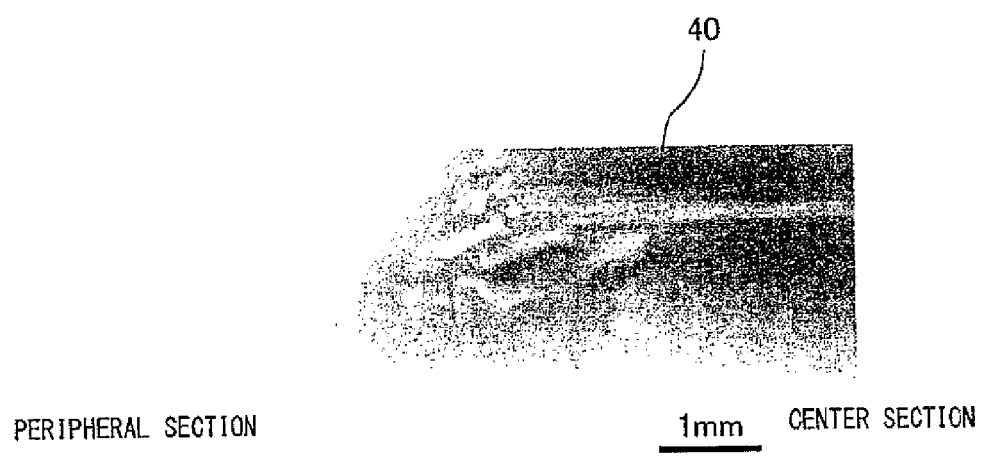

In the same manner as Example 1, a cross-section of the grown crystal was cut out and subjected to mirror polishing, and observed under an optical microscope in transparent mode. FIG. 18 shows an optical microscope photograph of the obtained grown crystal. The obtained SiC grown crystal had a substantially flat crystal growth plane, black sections were observed, and inclusions were present.

The maximum angle θ of the slope of the crystal growth plane with respect to the (000-1) just plane of the obtained grown crystal was −2.0°. The thickness of the crystal growth at the center section of the crystal growth plane was 2.6 mm, and the maximum diameter of the grown crystal was 17.1 mm.

Comparative Example 8

Crystal growth was performed under the same conditions as Example 4, except that a meniscus was formed with the raised position of the seed crystal substrate 14 at 1.5 mm from the liquid surface of the Si—C solution 24, the unidirectional rotational holding time of the seed crystal substrate was 30 seconds, and the crystal growth time was 10 hours.

In the same manner as Example 1, a cross-section of the grown crystal was cut out and subjected to mirror polishing, and observed under an optical microscope in transparent mode. The obtained SiC grown crystal had a concave crystal growth plane, black sections were observed, and inclusions were present.

The maximum angle θ of the slope of the crystal growth plane with respect to the (000-1) just plane of the obtained grown crystal was −10.0°, and the maximum angle θ of the slope for most of the crystal growth plane exceeded 8°. The thickness of the crystal growth at the center section of the crystal growth plane was 4.9 mm, and the maximum diameter of the grown crystal was 12.2 mm.

(Flow Direction Simulation for Si—C Solution)

Figure 19:
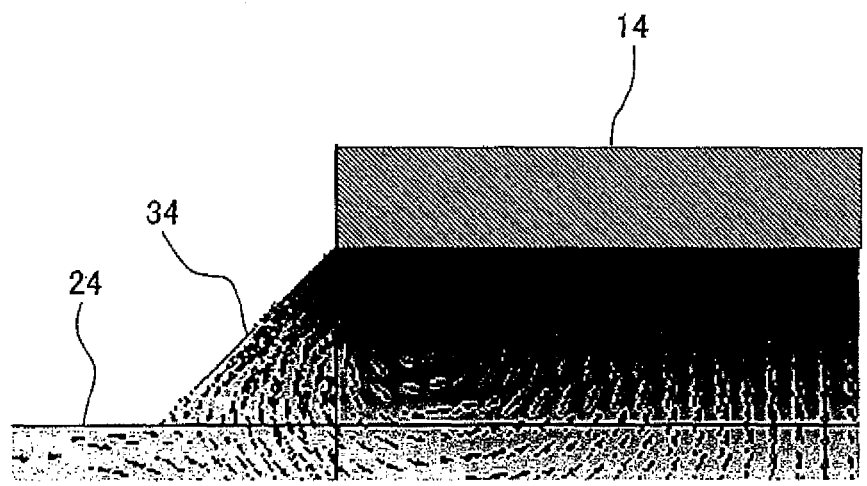
FIG. 19 shows the results of a simulation of the fluid state of a Si—C solution directly below the growth interface, where flow of the Si—C solution has stabilized under the conditions of Example 1.
Figure 20:
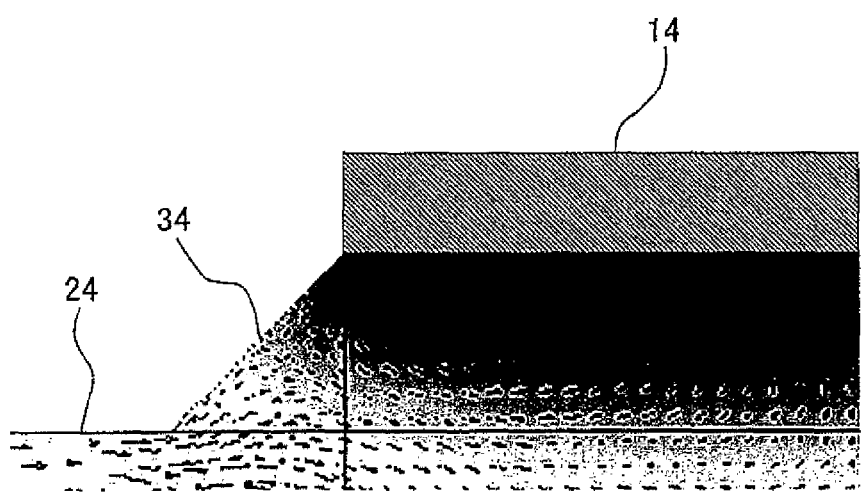
FIG. 20 shows the results of a simulation of the fluid state of a Si—C solution directly below the growth interface, where flow of the Si—C solution has stabilized under the conditions of Comparative Example 4.

The flow direction of the Si—C solution was simulated by using CG SIM. FIGS. 19 and 20 show the results of a simulation of the fluid state of a Si—C solution directly below the growth interface, where flow of the Si—C solution has stabilized under the conditions of Example 1 and Comparative Example 4, respectively.

Under the conditions of Example 1 in which a crystal rotational speed was high at 126 mm/sec, as illustrated in FIG. 19, the Si—C solution flowed from the depth of the Si—C solution 24 toward the center section directly below the seed crystal substrate 14 and a flow from center section to outer peripheral section was observed, while circulation of the Si—C solution flowing from outer peripheral section to the depth was also observed, without any stagnated region directly below the growth interface. In contrast, under the conditions of Comparative Example 4 in which the crystal rotational speed was low at 25 mm/sec, as illustrated in FIG. 20, flow of the Si—C solution was low and in particular the flow stagnated at the outer peripheral section directly below the growth interface and at the meniscus section, while a weak flow was seen from the outer peripheral section toward the center section, in contrast to Example 1.

The crystal growth conditions for the examples and comparative examples are shown in Table 1, while the growth plane shape of the obtained SiC grown crystal, the presence of inclusions, the thickness and diameter of the grown crystal and the maximum angle θ of the slope of the crystal growth plane are shown in Table 2.

TABLE 1

| | Seed crystal diameter (mm) | Seed crystal thickness (mm) | Gap at top of crucible (mm) | Raising position of seed crystal (mm) | Rotational speed of Seed crystal holding shaft (rpm) | circumferential speed of Seed crystal (mm/s) | Rotation holding time (sec) | Rotational speed of crucible (rpm) | Growth time (hr) |
|---|---|---|---|---|---|---|---|---|---|
| Example 1 | 16 | 1 | 4.0 | 1.0 | 150 | 126 | 36,000 | 0 | 10 |
| Example 2 | 45 | 1 | 3.0 | 3.0 | 100 | 236 | 360 | 0 | 14 |
| Example 3 | 16 | 1 | 4.0 | 1.7 | 150 | 126 | 7,200 | 0 | 2 |

TABLE 1-continued

|  | Seed crystal diameter (mm) | Seed crystal thickness (mm) | Gap at top of crucible (mm) | Raising position of seed crystal (mm) | Rotational speed of Seed crystal holding shaft (rpm) | circumferential speed of Seed crystal (mm/s) | Rotation holding time (sec) | Rotational speed of crucible (rpm) | Growth time (hr) |
|---|---|---|---|---|---|---|---|---|---|
| Example 4 | 16 | 1 | 4.0 | 1.3 | 120 | 101 | 360 | 0 | 20 |
| Example 5 | 12 | 1 | 4.0 | 1.3 | 100 | 63 | 18,000 | 0 | 5 |
| Example 6 | 12 | 1 | 4.0 | 1.3 | 100 | 63 | 3,600 | 0 | 10 |
| Example 7 | 12 | 1 | 4.0 | 1.5 | 100 | 63 | 360 | 0 | 30 |
| Comp. Ex. 1 | 25 | 1 | 1.5 | 1.3 | 40 | 52 | 15 | 5 | 18 |
| Comp. Ex. 2 | 12 | 1 | 0.5 | 0 | 100 | 63 | 360 | 0 | 5 |
| Comp. Ex. 3 | 16 | 1 | 2.0 | 1.5 | 100 | 63 | 360 | 0 | 10 |
| Comp. Ex. 4 | 12 | 1 | 4.0 | 1.7 | 40 | 25 | 18,000 | 5 | 5 |
| Comp. Ex. 5 | 12 | 1 | 4.0 | 1.0 | 40 | 25 | 15 | 5 | 10 |
| Comp. Ex. 6 | 12 | 1 | 4.0 | 1.0 | 0.4 | 0.3 | 36,000 | 0 | 10 |
| Comp. Ex. 7 | 12 | 1 | 4.0 | 1.3 | 100 | 63 | 15 | 5 | 5 |
| Comp. Ex. 8 | 16 | 1 | 4.0 | 1.5 | 120 | 101 | 30 | 0 | 10 |

TABLE 2

|  | Growth plane shape | Presence or absence of inclusions | Grown crystal thickness at center section (mm) | Grown crystal diameter (mm) | Maximum angle of slope θ (°) |
|---|---|---|---|---|---|
| Example 1 | Concave | Absent | 3.3 | 20.0 | 5.5 |
| Example 2 | Concave | Absent within 8° Present at >8° | 2.7 | 33.6 (within 8°) 44.6 (overall) | 8.0° at 33.6 mm diameter |
| Example 3 | Concave | Absent | 1.2 | 15.6 | 2.0 |
| Example 4 | Concave | Absent | 12.5 | 30.0 | 5.7 |
| Example 5 | Concave | Absent | 2.3 | 16.0 | 2.0 |
| Example 6 | Concave | Absent | 4.5 | 26.0 | 4.0 |
| Example 7 | Concave | Absent | 2.5 | 19.0 | 6.0 |
| Comp. Ex. 1 | Somewhat convex | Present | 8.0 | 35.0 | −0.6 |
| Comp. Ex. 2 | Convex | Present | 1.7 | 12.0 | −14.4 |
| Comp. Ex. 3 | Substantially flat | Present | 3.8 | 17.1 | 0.0 |
| Comp. Ex. 4 | Substantially flat | Present | 2.8 | 16.6 | −0.5 |
| Comp. Ex. 5 | Substantially flat | Present | 4.7 | 27.5 | −0.7 |
| Comp. Ex. 6 | Convex | Present | 3.1 | 15.0 | −2.3 |
| Comp. Ex. 7 | Substantially flat | Present | 2.6 | 17.1 | −2.0 |
| Comp. Ex. 8 | Concave | Present | 4.9 | 12.2 | 10.0 |

Figure 21:
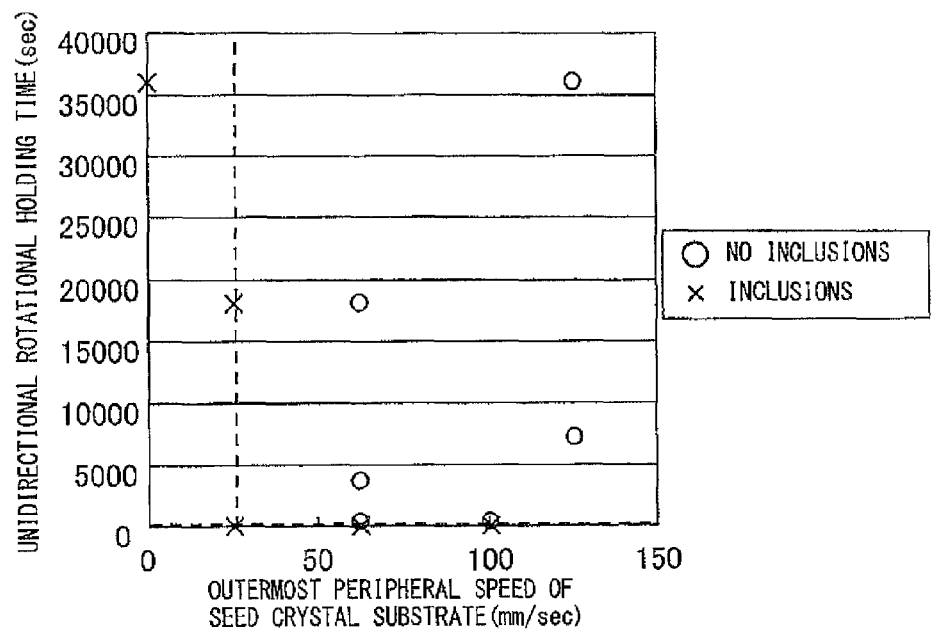
FIG. 21 is a graph showing the relationship between the presence of inclusions, and the circumferential speed and unidirectional rotational holding time of the seed crystal substrate, for the grown crystals obtained in the examples and comparative examples.
Figure 22:
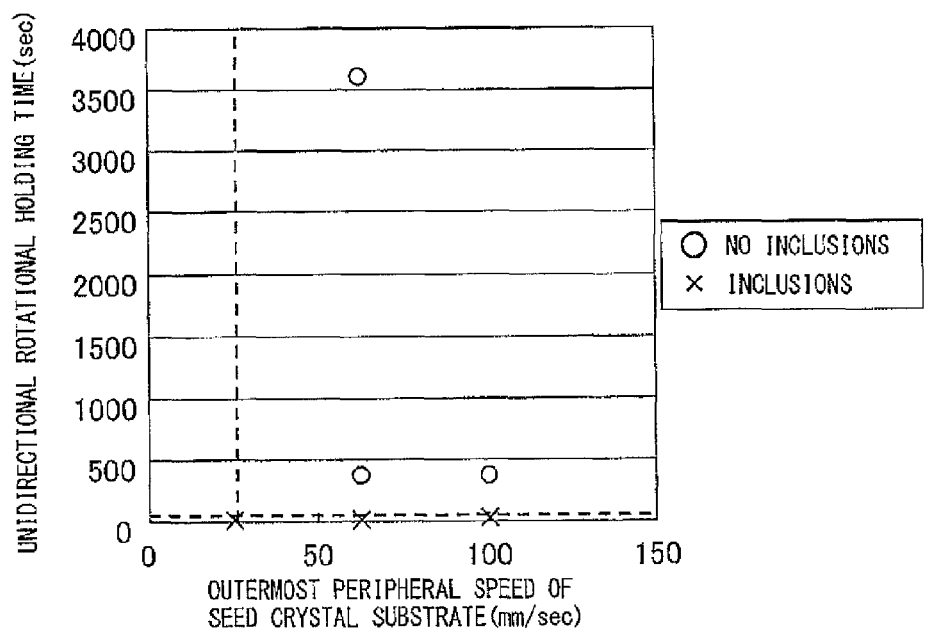
FIG. 22 is a graph showing an expanded view of the region with a short unidirectional rotational holding time in FIG. 21.

FIG. 21 is a graph showing the relationship between the presence of inclusions in the grown crystals obtained in Examples 1 and 3 to 7 and Comparative Examples 4 to 8, and the circumferential speed and unidirectional rotational holding time of the seed crystal substrate. FIG. 22 is a graph showing a magnified view of the region of short unidirectional rotational holding time in FIG. 21.

As seen in FIG. 21 and FIG. 22, a faster circumferential speed of the seed crystal substrate, and a longer unidirectional rotational holding time, can produce a SiC single crystal containing no inclusions.

EXPLANATION OF SYMBOLS

100 Single crystal production apparatus
10 Crucible
12 Seed crystal holding shaft
14 Seed crystal substrate
16 Just plane of seed crystal substrate
18 Heat-insulating material
20 Concave crystal growth plane
22 High-frequency coil
22A Upper level high-frequency coil
22B Lower level high-frequency coil
24 Si—C solution
26 Quartz tube
28 Opening at top of crucible
34 Meniscus
40 SiC grown crystal
42 Cut grown crystal
46 Inclusion region in grown crystal
48 SiC single crystal region in grown crystal
50 Side section of seed crystal holding shaft
52 Center section of seed crystal holding shaft
54 Heat-insulating material disposed at center section of seed crystal holding shaft
56 High thermal conductivity material

What is claimed is:

1. A method for producing a SiC single crystal by a solution process in which a seed crystal substrate held on a seed crystal holding shaft is contacted with a Si—C solution having a temperature gradient such that the temperature decreases from the interior toward the surface, to cause crystal growth of the SiC single crystal, the method comprising:

lowering the temperature of the Si—C solution at the outer peripheral section directly below the interface with the crystal growth plane to be lower than the temperature of the Si—C solution at the center section directly below the interface with the crystal growth plane, and causing the Si—C solution to flow from the center section directly below the interface with the crystal growth plane to the outer peripheral section directly below the interface with the crystal growth plane, wherein lowering the temperature of the Si—C solution comprises forming a meniscus between the seed crystal substrate and the Si—C solution by raising the seed crystal substrate and holding the seed crystal substrate at a position where a bottom face of the seed crystal substrate is higher than a liquid surface of the Si—C solution after the seed crystal substrate is contacted with the Si—C solution.

2. The method for producing a SiC single crystal according to claim 1, wherein causing flow of the Si—C solution comprises rotating the seed crystal substrate in a direction along the outer periphery of the seed crystal substrate while switching the rotational direction, and wherein rotating the seed crystal substrate comprises rotating the outer peripheral section of the seed crystal substrate at a speed faster than 25 mm/sec, and for a longer time than 30 seconds continuously in the same direction.

3. The method for producing a SiC single crystal according to claim 2, wherein the method comprises rotating the outer peripheral section of the seed crystal substrate at a speed of 63 mm/sec or more.

4. The method for producing a SiC single crystal according to claim 2, wherein the method comprises rotating the seed crystal substrate continuously in the same direction for a time of 360 seconds or more.

5. The method for producing a SiC single crystal according to claim 1, wherein the seed crystal holding shaft has a constitution in which the side section of the seed crystal holding shaft exhibits higher thermal conductivity than the center section.

6. The method for producing a SiC single crystal according to claim 5, wherein the center section of the seed crystal holding shaft has a hollow part.

7. The method for producing a SiC single crystal according to claim 6, wherein a heat-insulating material is disposed in at least part of the hollow part of the seed crystal holding shaft.

8. An apparatus for production of a SiC single crystal by a solution process in which a seed crystal substrate held on a seed crystal holding shaft is contacted with a Si—C solution heated so as to have a temperature gradient such that the temperature decreases from the interior toward the surface, to cause crystal growth of the SiC single crystal from the seed crystal substrate, the apparatus comprising:

a crucible that houses a Si—C solution, a heating device situated surrounding the crucible, and a seed crystal holding shaft situated in a movable manner in the up-down direction, the apparatus further comprising:

a temperature control means that lowers the temperature of the Si—C solution at the outer peripheral section directly below the interface with the crystal growth plane to be lower than the temperature of the Si—C solution at the center section directly below the interface with the crystal growth plane, and a flow means that causes the Si—C solution to flow from the center section directly below the interface with the crystal growth plane to the outer peripheral section directly below the interface with the crystal growth plane, wherein the temperature control means comprises the seed crystal holding shaft, and the seed crystal holding shaft has a hollow part in the center section and a heat-insulating material in at least part of the hollow part so that the seed crystal holding shaft has higher thermal conductivity at the side sections than at the center section, the hollow part having a cylindrical shape along a longitudinal axis of the seed crystal holding shaft and being arranged between at least a portion of the heat-insulating material and an outer circumferential portion of the seed crystal holding shaft along the longitudinal axis; and wherein the flow means comprises a rotating device for a rotating the seed crystal substrate for mechanical stirring of the Si—C solution, and/or the heating device comprises a high-frequency heating device for high-frequency heating the Si—C solution and the flow means comprises the high-frequency heating device for electrical magnetic stirring of the Si—C solution.

9. A SiC single crystal ingot containing a seed crystal substrate and a SiC grown crystal grown from the seed crystal substrate by using a solution process, wherein the grown crystal has a concave crystal growth plane and contains no inclusions.

10. The SiC single crystal ingot according to claim 9, wherein the maximum angle θ of the slope of the concave crystal growth plane with respect to the just plane of growth of the grown crystal is in the range of $0<\theta\leq 8°$.

11. The SiC single crystal ingot according to claim 9, wherein the growth thickness of the grown crystal is 3 mm or greater.

12. The SiC single crystal ingot according to claim 9, wherein the diameter of the grown crystal is 6 mm or greater.

* * * * *